United States Patent [19]

Itoh et al.

[11] Patent Number: 4,937,454
[45] Date of Patent: Jun. 26, 1990

[54] RADIATION DETECTOR

[75] Inventors: Haruo Itoh, Hino; Toshikazu Shimada, Kokubunji; Shin-ichi Muramatsu, Higashiyamato; Tetsuhiko Takahashi, Tokyo; Hiroshi Takeuchi, Matsudo, all of Japan

[73] Assignee: Hitachi, Ltd., Tokyo, Japan

[21] Appl. No.: 273,572

[22] Filed: Nov. 21, 1988

[30] Foreign Application Priority Data

Nov. 19, 1987 [JP] Japan .................. 62-290642

[51] Int. Cl.$^5$ ............................................ H01L 31/00
[52] U.S. Cl. .................... 250/370.11; 357/30
[58] Field of Search ............... 250/370.11; 357/30 K, 357/30 B

[56] References Cited

U.S. PATENT DOCUMENTS 4,365,107 12/1982 Yamauchi .................. 136/258

FOREIGN PATENT DOCUMENTS 0177044 4/1986 European Pat. Off. ......... 357/30 K
57-172273 10/1982 Japan .................. 357/30 K
59-188965 10/1984 Japan .................. 357/30 K Primary Examiner—Constantine Hannaher
Attorney, Agent, or Firm—Antonelli, Terry, Stout & Kraus

[57] ABSTRACT

In a radiation detector having a scintillator and a photodiode in combination, an amorphous silicon diode of a refractive index of 3.5 or below is used for a photodetector to have a decreased junction capacitance. This shifts the spectral sensitivity characteristic of the photodetector toward the short wavelength side, thus providing a low-noise, high-sensitivity radiation detector matched well with the emission spectrum of the scintillator.

8 Claims, 3 Drawing Sheets

RADIATION DETECTOR

FIELD OF THE INVENTION

This invention relates to a radiation detector, and is particularly concerned with a radiation detector with high S/N ratio.

DESCRIPTION OF THE PRIOR ART

An X-ray detector for CT scanner will be taken up for description as one example of the radiation detector. A typical X-ray detector includes that for which scintillator and photodiode are combined. A progress of research for application of amorphous materials today has made it possible to apply an amorphous silicon diode to the photodiode (as reported in "OYO BUTURI", 1986, published by Japan Society of Applied Physics, P.824). Then, Japanese Patent Laid-Open No. 71881/1987 and Japanese Patent Laid-Open No. 43585/1987 may be mentioned as relating to such element.

SUMMARY OF THE INVENTION

In the prior art mentioned above, an art fostered by research of an amorphous silicon (hereinafter abbreviated as a-Si) solar cell and development of a-Si photodiode for one-dimensional line sensor for facsimile has been applied with reference to the a-Si photodiode. However, since the scope of application varies, the photodiode developed in these technical fields has not necessarily been optimized for use on radiation detectors.

That is, with reference to the noise characteristic which is an essential function for radiation detectors, it is necessary that a noise caused by the detector be substantially small as compared with a radiation quantum noise, however, the problem is that a performance of the prior art a-Si photodiode is not to satisfy the requirements.

An object of the invention is to provide a radiation detector with high S/N ratio.

The aforementioned object will be attained by a radiation detector consisting of a scintillator for converting radiation into light, and a semiconductor light receiving element for converting the light emitted from the scintillator into an electrical signal, wherein a main optical active layer of the light receiving element comprises a non-single-crystalline material which exhibits a refractive index of 3.5 or below for the main emission wavelength of the scintillator. The refractive index of 3.5 or below is small as compared with that of a-Si being 4.0, which corresponds to a dielectric constant being small. The small dielectric constant decreases the junction capacitance of a pn junction or a Schottky junction, hence effectively decreasing capacitive noise. The reason will be described hereinlater.

The radiation detector may be obtained through putting a scintillator and a light receiving element together which are manufactured separately, however, it is preferable that the light receiving element be formed successively on the scintillator directly or through a substantially transparent thin film. There may be a case where the thin film is provided for smoothing or protecting the surface or other purpose.

Then, a thin-film electronic circuit for processing electrical signals from the light receiving element can also be formed on the scintillator together with the light receiving element.

Described first is a detection system noise. FIG. 2 represents a detector circuit with a radiation detector and I-V converter combined therefor. A reference numeral 21 denotes an element photodiode, 22 denotes an operational amplifier, 23($C_f$), 24($C_R$) denote a capacitance and a feedback resistance respectively. One example of a result obtained through measuring an output noise voltage of the detector is shown in FIG. 4. The a-Si photodiode used for measurement has a pin structure, and its light receiving area is 20 mm$^2$. The i-layer is normally a-Si:H, however, a-Si$_{1-x}$C$_x$:H is used here and a refractive index is minimized from changing x. From the drawing, it is understood that an output noise voltage $V_D$ decreases according as a refractive index of the i-layer material is minimized. The reason will be observed as follows. A refractive index n and a dielectric constant $\epsilon$ are correlated as:

$$n = \sqrt{\epsilon} \tag{1}$$

further, a diode junction capacitance C is expressed by the following equation according to $\epsilon$:

$$C = \epsilon \epsilon_0 \frac{S}{W} \tag{2}$$

where $\epsilon_0$ denotes a vacuum dielectric constant, S denotes a diode area, and W denotes a depletion layer width. Accordingly, to minimize the refractive index in FIG. 4 is to minimize the junction capacitance, and the result of FIG. 4 indicates that a noise dependent on the input capacitance can be decreased.

Further, an amorphous silicon alloy material with small refractive index has a wide optical band gap, and a wavelength for maximum photocurrent sensitivity of the a-Si photodiode using the aforementioned material becomes short. That is, wavelength for maximum photocurrent sensitivity of the normal a-Si photodiode comes within 550 to 600 nm, however, from using the amorphous silicon alloy material with small refractive index and wide optical band gap for the i-layer, wavelength for maximum photocurrent sensitivity can be retained within 450 to 500 nm. Sensitivity sharply increases particularly from using the photodiode for light reception of CdWO$_4$ emitting light mainly at 400 to 450 nm and Ga$_2$O$_2$S: Pr, Ce, F at about 510 nm. An i-layer refractive index dependency of the output voltage when the detector shown in FIG. 2 which comprises a photodiode and an operational amplifier is used is shown in FIG. 3.

The (S/N)$_D$ of a detection system obtained from measuring results of FIG. 3 and FIG. 4 is shown in FIG. 1. From the drawing, it is understood that the larger n is, the lower (S/N)$_D$ is.

A lower bound value of (S/N)$_D$, or an upper bound value of refractive index n will be taken into consideration as follows. First, a noise is described in detail. A voltage-converted noise $V_N$ of the detection signal is:

$$V_N^2 = V_X^2 + V_D^2 \tag{3}$$

$V_X$: X-ray quantum noise
$V_D$: detection system noise
therefore, if the signal voltage is $V_s$:

$$\left(\frac{S}{N}\right)^2 = \frac{V_S^2}{V_N^2} = \frac{V_S^2}{V_x^2 + V_D^2} \quad (4)$$

The X-ray quantum noise $V_x$ can be written as:

$$V_x = V_S \sqrt{x \cdot t} \quad (5)$$

t: X-ray irradiation time
x: X-ray absorption rate of detector per unit time
In the case of diagnostic X-ray CT scanner, an X-ray 120 kV in X-ray tube voltage is irradiated, for example, at 1 mR for 1 ms per profile data. Passing through the human abdomen, the X-ray is attenuated to about 1/1,000, therefore with an X-ray absorption rate of the scintillator at 0.9 and an X-ray incident area of the scintillator at 20 mm², the X-photon number $\sqrt{x \cdot t}$ absorbed by the detector is:

$$1.2 \times 10^4 \text{ (X-photon number/element)} \quad (6)$$

The $(S/N)_x$ caused by the X-ray quantum noise is:

$$(S/N)_x = \sqrt{x \cdot t} = 110 \quad (7)$$

or so from Eqs. (4), (5) and (6).

Described next is a relation between detection system noise and X-ray quantum noise. The extent of how many times of X-ray quantum noise voltage $V_x$ is the detection signal noise voltage $V_N$ permitted as an X-ray CT system varies according to a pickup portion and an object of diagnosis, however, it is practically required that $V_N$ be 1.2 times of $V_x$ or below. Thus, $$V_N \leq 1.2 V_x \quad (8)$$

is a required specification, and the following equation holds between the detection system noise $V_D$ and the X-ray quantum noise $V_x$ from Eq. (3):

$$V_D \leq 0.66 V_x \quad (9)$$

From Eq. (9):

$$\left(\frac{S}{N}\right)_D \geq \frac{1}{0.66}\left(\frac{S}{N}\right)_x = 1.5\left(\frac{S}{N}\right)_x \quad (10)$$

For example, a refractive index of the i-layer satisfying Eq. (10) in the result of FIG. 1 is 3.5 or below at $(S/N)_x = 110$. That is, it can be said that refractive index of the i-layer must be 3.5 or below from the above observation and the result of FIG. 1.

DETAILED DESCRIPTION OF THE PREFERRED EMBODIMENTS

EXAMPLE 1

Figure 2:
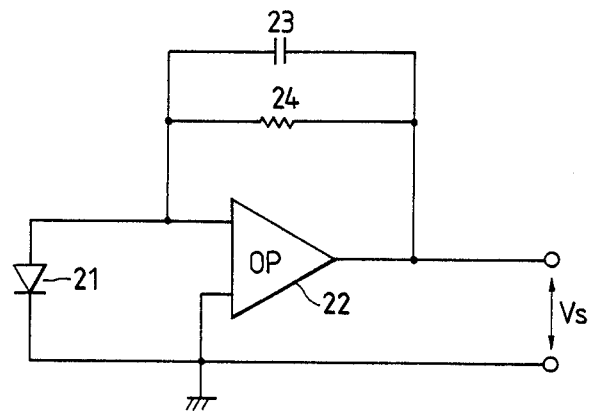
FIG. 2 is an electronic circuit diagram for illustrating the invention.
Figure 5:
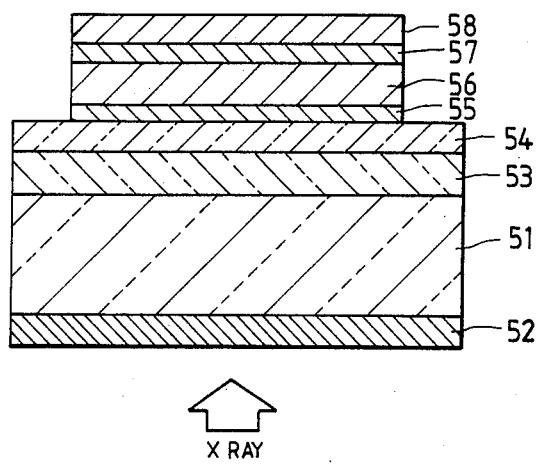
FIG. 5 is a section view of a detector given in one embodiment of the invention.

FIG. 5 is a section view of one example of element structure. A reference numeral 51 denotes a scintillator of $CdWO_4$ or $Gd_2O_2S$: Pr, Ce, F obtained through hot isostatic press method, and is 1.5 mm in thickness and 1.2 mm × 30 mm in area of X-ray receiving plane. One example of the relative proportions of $Gd_2O_2S$: Pr, Ce, F is $(Gd_{0.999} Pr_{0.001} Ce_{6 \times 10^{-6}})_2 O_2S$: F (F:90 wt. ppm). The upper and lower surfaces are subjected to mirror polish. An Al evaporated film is formed on the X-ray incident plane as a light reflecting layer 52 for reflecting fluorescence. A transparent layer 53 consisting of $SiO_2$ is disposed on the scintillator upper surface. The thickness is 1 μm. An a-Si photodiode 59 is formed on the transparent layer 53. That is, a transparent electrode 54 ($SnO_2$) is formed first, and then amorphous silicon layers of p-type, i-type and n-type are formed in that order through glow discharge decomposition. A reference numeral 55 denotes a boron-doped p-type a-SiC: H film 0.01 μm in thickness and 2.1 eV or over in optical band gap, 56 denotes an i-type a-SiC: H film 0.5 μm in thickness and 1.8 to 2.0 eV in optical band gap, and 57 denotes a phosphorus-doped n-type hydrogenated microcrystalline silicon film 0.03 μm in thickness. Here, the i-type layer has its optical band gap, refractive index and dielectric constant adjusted to arbitrary values by changing the flow ratio of monosilane to methane gas. For example, refractive indexes at x values of 0.1, 0.2 and 0.3 of a-$Si_{1-x}C_x$: H formed by increasing the methane flow to the monosilane flow are 3.5, 3.1 and 2.7 respectively. These values are smaller than the refractive indices of a-Si, i.e. about 4; thus, a high S/N ratio, for example, 200 or more, is obtained. The p-type layer is formed of a mixture of monosilane, methane and diborane gases. Gas flow rates are 6 cc/min (100% $SiH_4$), 14 cc/min ($CH_4$), 5 cc/min, (1% $B_2H_6$), respectively, and the n-type layer is formed of a mixture of monosilane and phosphine gases gas flow rates are 2 cc/min (100% $SiH_4$), 50 cc/min (0.2% $PH_4$), respectively. An Al electrode 58 is formed on the n-layer. A size of the Al electrode is specified at 1 mm × 25 mm. The transparent electrode and the Al electrode are extracted, and the output signal has current converted into voltage by means of a low-noise operational amplifier in the detection circuit shown in FIG. 2.

Figure 1:
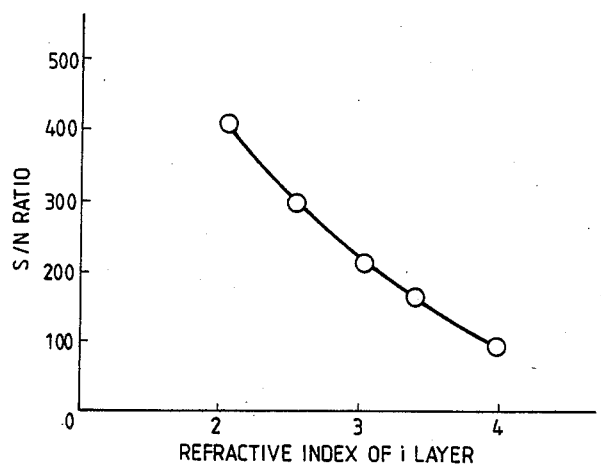
FIG. 1 is an explanatory drawing of S/N ratio indicating an effect of the invention.
Figure 3:
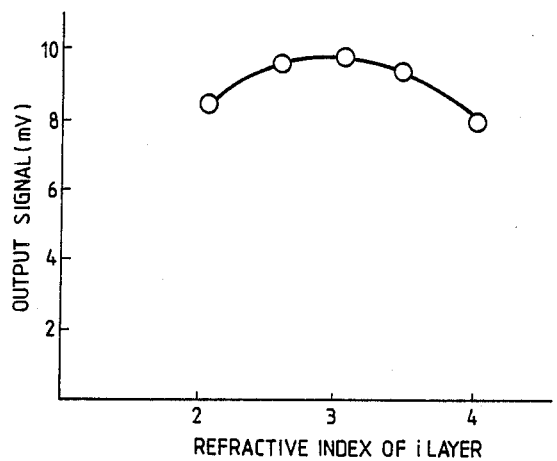
FIG. 3 is an explanatory drawing of an output voltage illustrating the invention.
Figure 4:
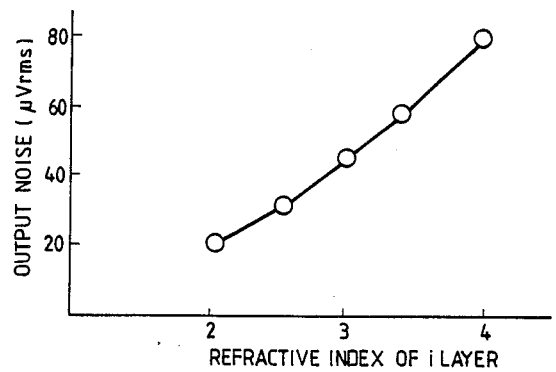
FIG. 4 is an explanatory drawing of an output noise voltage illustrating the invention.

An output voltage when X-ray of 1 μR/1 ms is irradiated is shown in FIG. 3, and a noise voltage when the X-ray is not irradiated is shown in FIG. 4. Further, a result obtained through calculating $(S/N)_D$ of the detector from both results is shown in FIG. 1.

Then, the light reflecting layer 52 will not necessarily be formed. Further, $Si_{1-x}N_x$, $Ta_2O_5$ or the like will be employed for the transparent layer 53.

EXAMPLE 2

Figure 6:
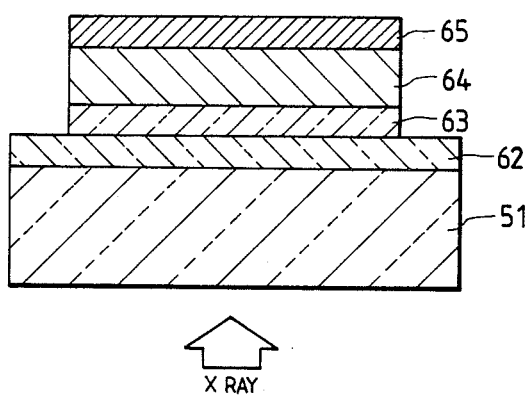
FIG. 6 is a sectional view of a detector given in another embodiment of the invention.

Another embodiment will be described with reference to FIG. 6.

An ITO (indium tin oxide) layer 62 and a $TiO_2$ layer 63 are formed on the scintillator 51 of $Gd_2O_2S$: Pr, Ce, F. A microcrystalline Se 64 is formed thereon at 1 μm in thickness, and then an Au electrode 65 is formed. Thicknesses of ITO layer 62 and TiO$_2$ layer 63 are 200 nm and 50 nm respectively. A main optical active layer in the element is a microcrystalline Se, which corresponds to the i-type a-SiC in Example 1. A refractive index of the microcrystalline Se was 2.5. An output of the element is obtained through the detection circuit shown in FIG. 2.

The (S/N)$_D$ when X-ray of 1 μR/1 ms was irradiated was 300.

In the aforementioned embodiment, c-Si (crystal Si) diode consisting of IV group semiconductor and Se photodiode consisting of VI group semiconductor are exemplified for description, however, a high S/N ratio at 200 or over was obtained from the construction wherein the photodiodes consisting of III V group semiconductor such as GaP or the like indicating a refractive index at 3.5 or below, II VI group semiconductor such as CdSe, CdTe, ZnS, ZnSe and the like, and I-III-VI$_2$ such as CuInSe$_2$, CuInTe$_2$, CuGaSe$_2$ or the like are combined with the scintillator. The lower limit of the refractive index is that of the transparent electrode 54 e.g. 1.8 (SnO$_2$). If the refractive index is lower than the lower limit, light into the photodiode reflects at the transparent electrode and the output signal of the photodiode fall down abruptly. The thickness of this material is in the range of 1~2 μm.

Then, there is a problem of reflection loss at interface of the light incident on the photodiode from the scintillator. That is, in the prior art wherein a-Si photodiode is formed directly on the scintillator, since a transparent electrode 1.8 to 2.0 in refractive index is provided between the scintillator 2.2 or so in refractive index and a-Si layer 4 or so in refractive index, the refractive index is not matched satisfactorily among the scintillator, the transparent electrode and the a-Si layer, and thus a part of the light incident on the a-Si photodiode from the scintillator is lost by a reflection at interface. However, the problem could be solved by the invention.

In the structure comprising a scintillator, a transparent electrode and a-Si photodiode, a better matching of refractive index will be obtained than in case an amorphous silicon is used from using an amorphous silicon alloy with a small refractive index such as amorphous silicon carbide, amorphous silicon nitride and the like for i-layer of the pin-type a-Si photodiode. Thus, a reflection loss at interface of the light incident on the a-Si photodiode from the scintillator is decreased, and a photocurrent sensitivity is increased.

According to the invention, an S/N ratio of the detector can remarkably be enhanced. As a result, an S/N ratio of the detection signal is determined almost by a quantum noise only of the incident radiation. For example, an X-ray CT scanner using such detector is capable of providing an ideal CT picture having an S/N ratio of quantum noise only of the incident X-ray.

We claim:

1. A radiation detector comprising a scintillator for converting radiation into light having a main emission wavelength of a range from about 400 to 510 nm, a semiconductor light receiving element for converting the light emitted from the scintillator into an electrical signal, wherein a main optical active layer of said light receiving element consists of a non-single-crystalline material which exhibits a refractive index of 3.5 or below for the main emission wavelength of said scintillator.

2. The radiation detector as defined in claim 1, wherein said non-single-crystalline material includes at least one of groups IV, VI, II VI, III V, and I III VI$_2$ semiconductors.

3. The radiation detector as defined in claim 1, wherein said semiconductor light receiving element is a photodiode.

4. The radiation detector as defined in claim 1, wherein said non-single-crystalline material is an amorphous Si alloy material including C.

5. The radiation detector as defined in claim 1, wherein said light receiving element is formed on said scintillator directly or through a thin film.

6. The radiation detector as defined in claim 1, wherein said non-single-crystalline material is amorphous silicon nitride.

7. A radiation detector comprising a scintillator for converting radiation into light having a main emission wave-length of a range from about 400 to 510 nm; a photodiode formed on said scintillator and comprising a transparent electrode, a p-type semiconductor layer formed on said transparent electrode, a i-type non-single-crystalline semiconductor layer formed on said p-type semiconductor layer, a n-type semiconductor layer on said i-type non-single-crystalline semiconductor layer, an electrode formed on said n-type semiconductor layer, wherein said i-type non-single-crystalline semiconductor layer is a main optical active layer exhibiting a refractive index of 3.5 or below for the main emission wavelength of said scintillator.

8. The radiation detector as defined in claim 7 wherein said i-type, non-single-crystalline semiconductor is i-type a-Si$_{1-x}$C$_x$:H ($0.1 \leq x \leq 0.3$).

* * * * *